United States Patent
Osborne et al.

(10) Patent No.: US 9,824,857 B2
(45) Date of Patent: Nov. 21, 2017

(54) METHOD FOR IMPLANTATION OF SEMICONDUCTOR WAFERS HAVING HIGH BULK RESISTIVITY

(71) Applicant: Varian Semiconductor Equipment Associates, Inc., Gloucester, MA (US)

(72) Inventors: Michael W. Osborne, Clinton, MA (US); David E. Suuronen, Newburyport, MA (US); Julian G. Blake, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/131,520

(22) Filed: Apr. 18, 2016

(65) Prior Publication Data

US 2017/0207063 A1    Jul. 20, 2017

Related U.S. Application Data

(60) Provisional application No. 62/278,950, filed on Jan. 14, 2016.

(51) Int. Cl.
*H01J 37/30*    (2006.01)
*H01J 37/304*   (2006.01)
(Continued)

(52) U.S. Cl.
CPC ........ *H01J 37/304* (2013.01); *H01J 37/3171* (2013.01); *H01L 21/265* (2013.01);
(Continued)

(58) Field of Classification Search
CPC ......................... H01J 2237/0045; H01J 37/026
See application file for complete search history.

(56) References Cited

U.S. PATENT DOCUMENTS 6,100,536 A    8/2000  Ito et al.
6,489,225 B1 *  12/2002  Ross ................... H01L 21/2636
                                                    257/E21.333
(Continued)

FOREIGN PATENT DOCUMENTS

JP    2009238632 A    10/2009
JP    2014165076 A     9/2014

OTHER PUBLICATIONS

David E. Suuronen, System and Method for In Situ Temperature Measurement, filed as U.S. Appl. No. 14/934,652, filed Nov. 6, 2015.

(Continued)

*Primary Examiner* — Caridad Everhart
*Assistant Examiner* — Ankush Singal

(57) ABSTRACT

An ion implanter may include an electrostatic clamp to hold a substrate; a plasma flood gun generating a flux of electrons impinging upon the substrate; and a controller coupled to the plasma flood gun and including a component generating a control signal responsive to a measurement signal, the control signal to adjust operation of the plasma flood gun to a target operating level. At the target operating level the flux of electrons may comprise a stabilizing dose of electrons, the stabilizing concentration of electrons, the stabilizing concentration reducing a clamp current variation in the electrostatic clamp to a target value, the target value being less than a second value of clamp current variation when the plasma flood gun is not operating.

20 Claims, 9 Drawing Sheets

(51) Int. Cl.
*H01L 21/265* (2006.01)
*H01L 21/66* (2006.01)
*H01J 37/317* (2006.01)

(52) U.S. Cl.
CPC .............. *H01L 22/14* (2013.01); *H01L 22/20* (2013.01); *H01J 2237/30405* (2013.01); *H01J 2237/31703* (2013.01)

(56) References Cited

U.S. PATENT DOCUMENTS

| | | |
|---|---|---|
| 9,070,538 B2 | 6/2015 | Shajii et al. |
| 2005/0218344 A1* | 10/2005 | Starcher ................ H01J 37/026 250/492.21 |
| 2006/0284116 A1* | 12/2006 | Berrian ................ H01J 37/045 250/492.21 |
| 2007/0187615 A1* | 8/2007 | Low .................... H01J 37/3171 250/397 |
| 2013/0264498 A1 | 10/2013 | Chang et al. |
| 2014/0324372 A1 | 10/2014 | Suuronen et al. |
| 2015/0115796 A1 | 4/2015 | Shajii et al. |

OTHER PUBLICATIONS

International Search Report and Written Opinion mailed Apr. 18, 2017 for PCT Application No. PCT/US2017/012112 filed Jan. 4, 2017.

* cited by examiner

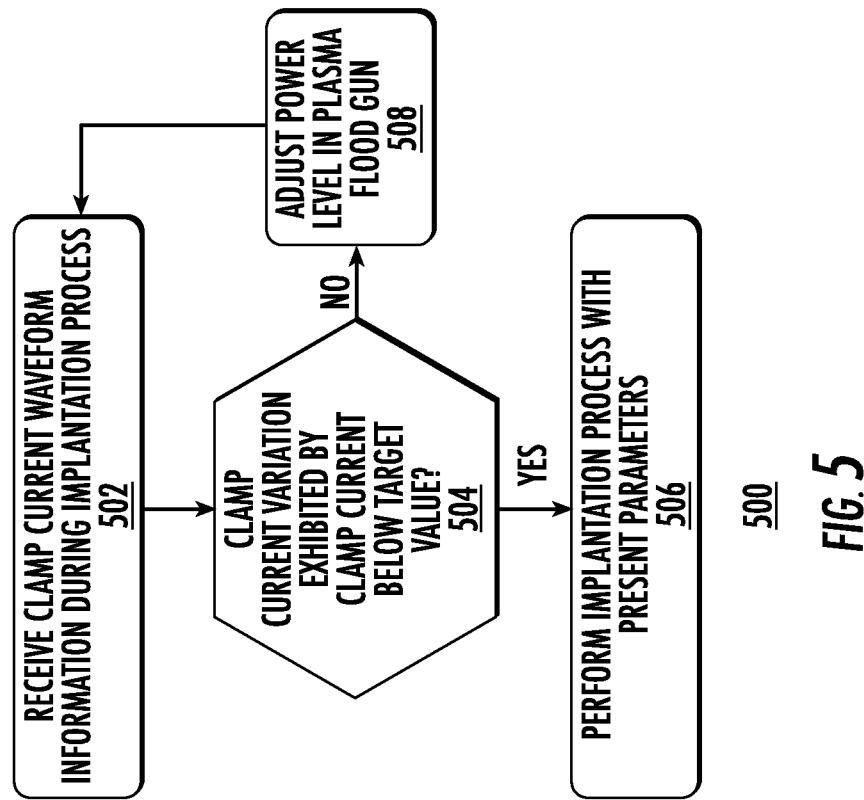

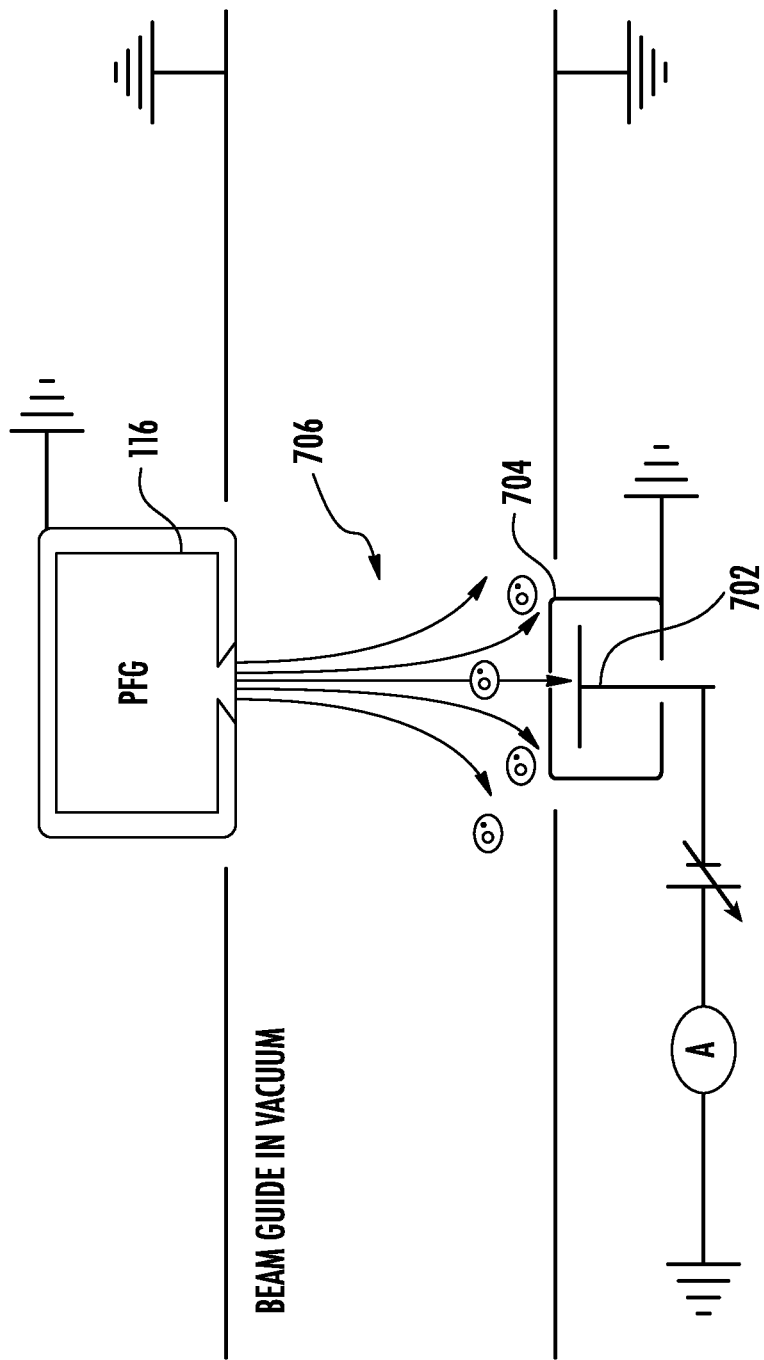

METHOD FOR IMPLANTATION OF SEMICONDUCTOR WAFERS HAVING HIGH BULK RESISTIVITY

RELATED APPLICATIONS

This application claims priority to U.S. provisional patent application No. 62/278,950 filed Jan. 14, 2016 and incorporated by reference herein in its entirety.

FIELD OF THE DISCLOSURE

Embodiments of the disclosure relate generally to techniques for manufacturing devices, and more particularly, to techniques for improved processing of substrates in an ion implantation apparatus.

BACKGROUND OF THE DISCLOSURE

Ion implantation is a process for introducing of introducing dopants, additives, or impurities into a substrate via ion bombardment. Known ion implantation systems or apparatus may comprise an ion source and a series of beam-line components. The ion source may comprise a chamber where desired ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In many applications, semiconductor substrates to be implanted have a bulk resistivity in the range of 10-30 Ω-cm, while in certain applications so called high bulk resistivity (HBR) substrates may be employed, where bulk resistivity exceeds 10-30 Ω-cm. Such resistivity values may be found, for example, in substrates for use in so called radio frequency silicon-on-insulator (RF SOI) devices or sensor devices.

One issue encountered when implanting HBR substrates such as semiconductor wafers having resistivity above 10-30 Ω-cm is the ability to process the HBR semiconductor wafers ("HBR wafers") without encountering handling errors during an implantation process, including processing in high current or medium current ion implantation apparatus. For example, electrostatic clamps may be used as wafer holders, where a clamp current is monitored during implantation for the purposes of detecting the presence or absence of a wafer on the electrostatic clamp. The monitoring of clamp current may insure wafer security to avoid wafer slippage and the risk of dropping a wafer during an implantation process. This method may work adequately for substrates having a resistivity of 10-30 Ω-cm, but may not work well for HBR substrates, leading to wafer handling problems.

For example, in some ion implantation systems, a safety mechanism may be employed, where an ion implanter stops implanting a wafer when the wafer clamp current becomes unstable, such as when large variations are detected. Because HBR wafers may engender such instabilities, the processing of HBR wafers in an ion implanter may be compromised, such as causing unnecessary shutdowns of an ion implanter when clamp current fluctuations become excessive. Many variables may complicate the ability to maintain stable monitoring of HBR wafers including the deviation of bulk resistivity from the reported value from the wafer supplier, variation in HBR wafer characteristics during implantation, such as causing intermittent, rapid reduction in clamp current with sequential implantation, as well as changes in bulk resistivity following implant.

With respect to these and other considerations the present disclosure is provided.

BRIEF SUMMARY

In one embodiment, an ion implanter may include an electrostatic clamp to hold a substrate; a plasma flood gun generating a flux of electrons impinging upon the substrate; and a controller coupled to the plasma flood gun and including a component generating a control signal responsive to a measurement signal, the control signal to adjust operation of the plasma flood gun to a target operating level. At the target operating level the flux of electrons may comprise a stabilizing dose of electrons, the stabilizing concentration of electrons, the stabilizing concentration reducing a clamp current variation in the electrostatic clamp to a target value, the target value being less than a second value of clamp current variation when the plasma flood gun is not operating.

In another embodiment, a method may include implanting a high bulk resistivity (HBR) wafer, the HBR wafer having a resistivity greater than 10-30 Ω-cm in an ion implanter; monitoring clamp current at an electrostatic clamp holding the HBR wafer; and directing electrons from a plasma flood gun (PFG) to the HBR wafer during the implanting, wherein a variation in the clamp current is maintained below a target value.

In a further embodiment, an apparatus may include an electrostatic clamp to hold a substrate; a plasma flood gun generating a flux of electrons impinging upon the substrate; a controller coupled to the plasma flood gun; and at least one computer readable medium comprising instructions, where the instructions, when executed, cause the controller to: receive a measurement signal; and generate a control signal responsive to the measurement signal, the control signal to adjust operation of the plasma flood gun, wherein a variation in the clamp current is maintained below a target value.

BRIEF DESCRIPTION OF THE DRAWINGS

FIG. 4 presents an exemplary process flow according to embodiments of the disclosure;

FIG. 5 presents another exemplary process flow according to other embodiments of the disclosure.

FIG. 7C depicts an exemplary retarding energy probe configuration.

DETAILED DESCRIPTION

The drawings are not necessarily to scale. The drawings are merely representations, not intended to portray specific parameters of the disclosure. Furthermore, the drawings are intended to depict exemplary embodiments of the disclosure, and therefore is not considered as limiting in scope.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a device as appearing in the figures. The terminology will include the words specifically mentioned, derivatives thereof, and words of similar meaning and/or significance.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Various embodiments of the disclosure provide apparatus, systems, and methods for improved substrate processing in an ion implantation apparatus, or ion implanter. Various embodiments provide a plasma flood gun to improve wafer handling for HBR substrates as detailed below. Examples of systems and plasma flood guns to be employed in some embodiments include pinched plasma flood guns or other types of plasma flood guns. The embodiments are not limited in this context.

Figure 1:
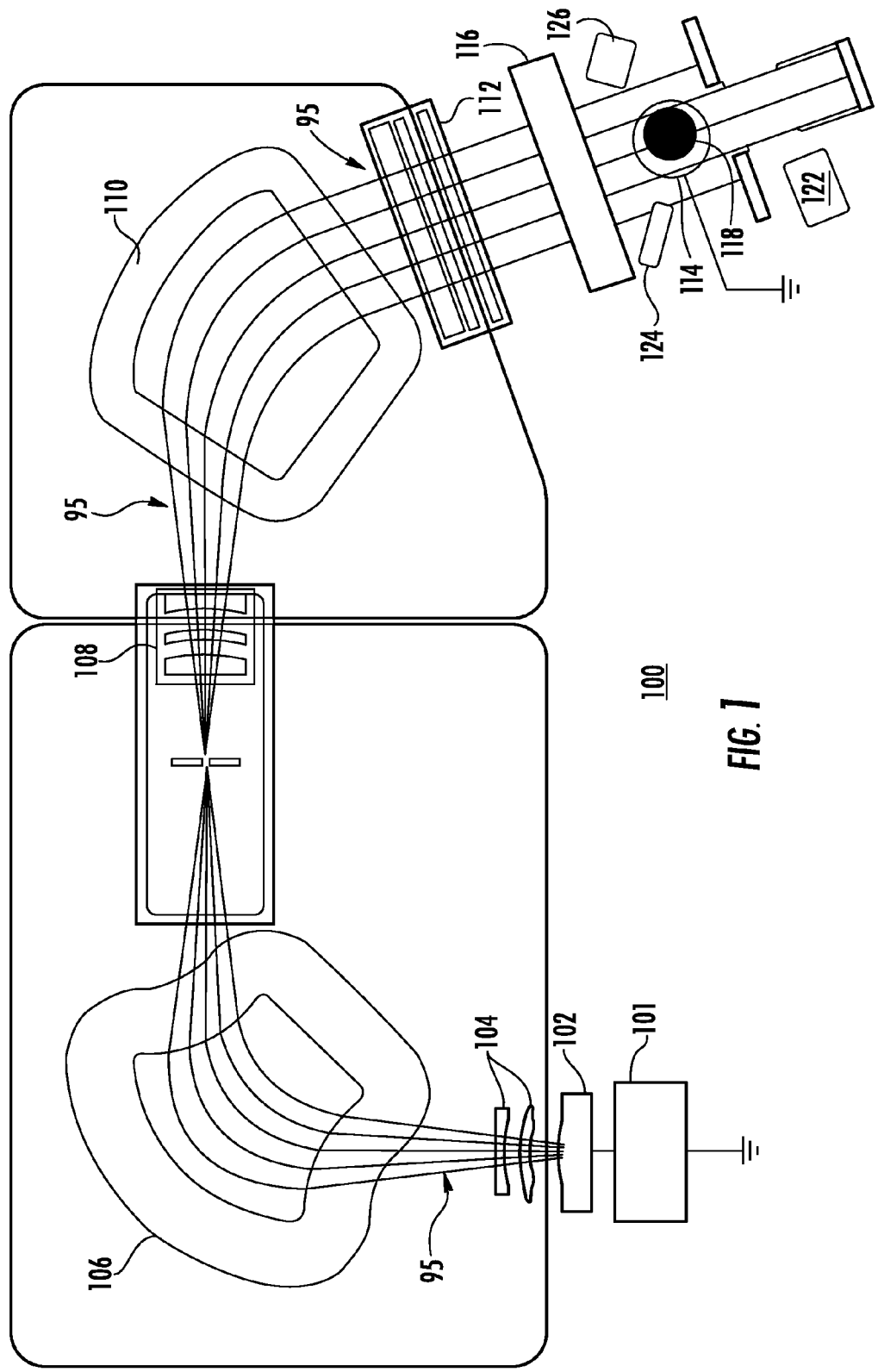
FIG. 1 discloses an exemplary ion implanter according to embodiments of the disclosure.

An exemplary high current ion implanter, shown as ion implanter 100, is generally depicted in FIG. 1 and includes an ion source chamber 102, and a series of beam line components directing the ion beam to a substrate, where in one exemplary non-limiting embodiment may be a silicon wafer. These components are housed in a vacuum environment and configured to provide ion dose levels with high or low energy implantation based on the desired implant profile. In particular, ion implanter 100 includes an ion source chamber 102 to generate ions of a desired species. The ion source chamber 102 has an associated hot cathode powered by power supply 101 to ionize feed gas introduced into the ion source chamber 102 to form a plasma, where the plasma comprises an ionized gas containing ions and free electrons. The hot cathode may be, for example, a heated filament or an indirectly heated cathode.

Different feed gases may be supplied to the ion source chamber 102 to generate ions having particular dopant characteristics. The ions may be extracted from ion source chamber 102 via a standard three (3) extraction electrode configuration used to create a desired electric field to focus the ion beam 95 extracted from ion source chamber 102. Ion beam 95 passes through a mass analyzer chamber 106 having a magnet functioning to pass just ions having the desired charge-to-mass ratio to a resolving aperture. In particular, the analyzer magnet can include a curved path where the ion beam 95 is exposed to the applied magnetic field, causing ions having the undesired charge-to-mass ratio to be deflected away from the beam path. Deceleration stage 108 (also referred to as a deceleration lens) may include a plurality of electrodes (e.g., three) with a defined aperture and is configured to output the ion beam 95. A collimator magnet 110 is positioned downstream of deceleration stage 108 and is configured to deflect the ion beam 95 into a ribbon beam having parallel trajectories. A magnetic field may be used to adjust the deflection of the ions via a magnetic coil.

The ion beam 95 is targeted toward a work piece attached to a support, or platen 114. A deceleration stage 112 may also be utilized, and may be disposed between collimator magnet 110 and platen 114. Deceleration stage 112 (also referred to as a deceleration lens) is positioned close to a target substrate on platen 114 and may include a plurality of electrodes (e.g., three) to implant the ions into the target substrate at a desired energy level. Because the ions lose energy when they collide with electrons and nuclei in the substrate, they come to rest at a desired depth within the substrate based on the acceleration energy. The ion beam may be distributed over the target substrate by beam scanning, by substrate movement using platen 114, or by a combination of beam scanning and substrate movement. A plasma flood gun (PFG) 116 can be positioned immediately upstream of the platen 114 to apply plasma to the ion beam 95 just before the beam 95 impacts the substrate. Although illustrated for use with a high current ion implanter, ion implanter 100 of FIG. 1, the PFG 116 may be utilized with other high current ion implanters and any other ion implanter such as medium current (MC) and high energy (HE) ion implanters.

In accordance with some embodiments of the disclosure, the stability of clamp current in an ion implanter during processing of HBR substrates having a resistivity such as 3,000-4,000 Ω-cm may be increased when using a plasma flood gun (PFG) as detailed below. In other embodiments, the stability of clamp current in an ion implanter during processing of an HBR substrate having a resistivity above 10-30 Ω-cm, where such substrate may also having a wafer surface coating, may likewise be increased when using a plasma flood gun (PFG). In particular, exemplary PFGs of the present embodiments provide sufficient energy density (i.e., more charge carriers) and sufficient electron energy at the surface of implanted regions, resulting in more electrons reaching the surface of wafers, so as to improve clamp current stability.

The ion implanter 100 may include an electrostatic clamp, where the electrostatic clamp is included as part of the platen 114 to hold a substrate 118. The ion implanter 100 may additionally include a current monitor 124 coupled to the electrostatic clamp, shown as platen 114, in order to measure clamp current provided by a clamp power supply 122.

The ion implanter 100 may also include a controller 126, where the controller 126 is coupled to the PFG 116 and to the current monitor 124. The controller 126 may be embodied in any combination of software and hardware, including logic such as control logic. For example, the clamp current variation may be measured as a function of TPFG power at the PFG 116, so the power at the TPFG can be adjusted by controller 126 to generate a targeted level of stability in clamp current. For example, the TPFG power may be adjusted to achieve a fluctuation in clamp current of less than 0.5 mA. The embodiments are not limited in this context.

The present inventors have unexpectedly discovered the stability of wafer clamp current using a 3,000-4,000 Ω-cm HBR substrate, as well as with coated HBR substrates much greater than 4,000 Ω-cm, is significantly improved using a toroidal plasma flood gun, when RF power generated at a sufficiently high power level, in the range of 200 W to 600 W but not necessarily limited to this range. In particular, a series of experiments were conducted where power in a TPFG was varied in 100 W increments to 200 W, 300 W, 400 W, 500 W, and 600 W. As power increases, HBR substrate clamp current values were observed to increase together with a smaller clamp current variation. The TPFG operation at 200 W sometimes results in an interruption of the implant, so operation at 200 W may be considered near the "edge" of implant interruption. At power levels above 200 W, there are no interruptions to the implant process observed.

Figure 2A:
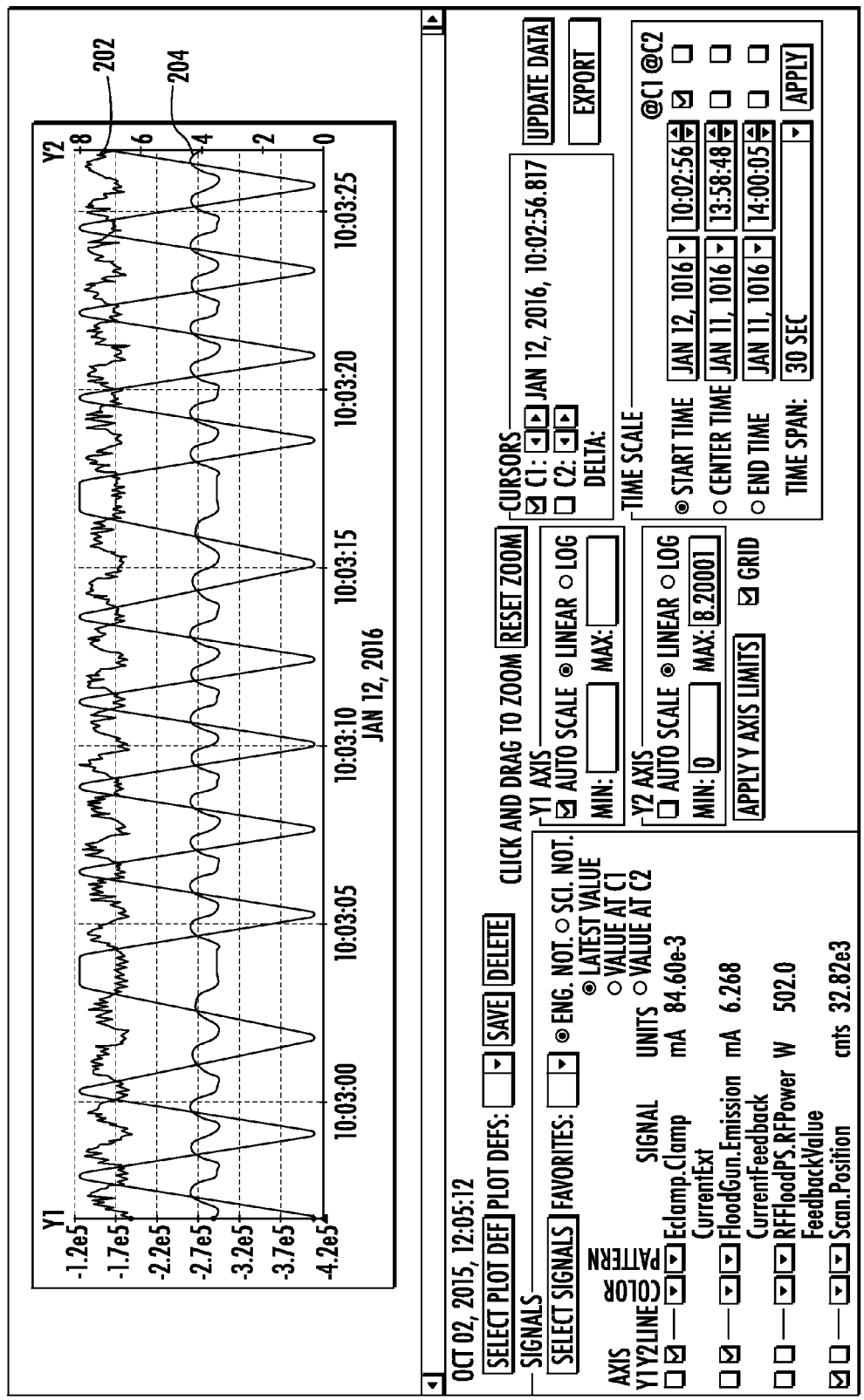
FIG. 2A and FIG. 2B present the experimental results of current measurement during operation of a medium current ion implanter, according to an embodiment of the disclosure.
Figure 2B:
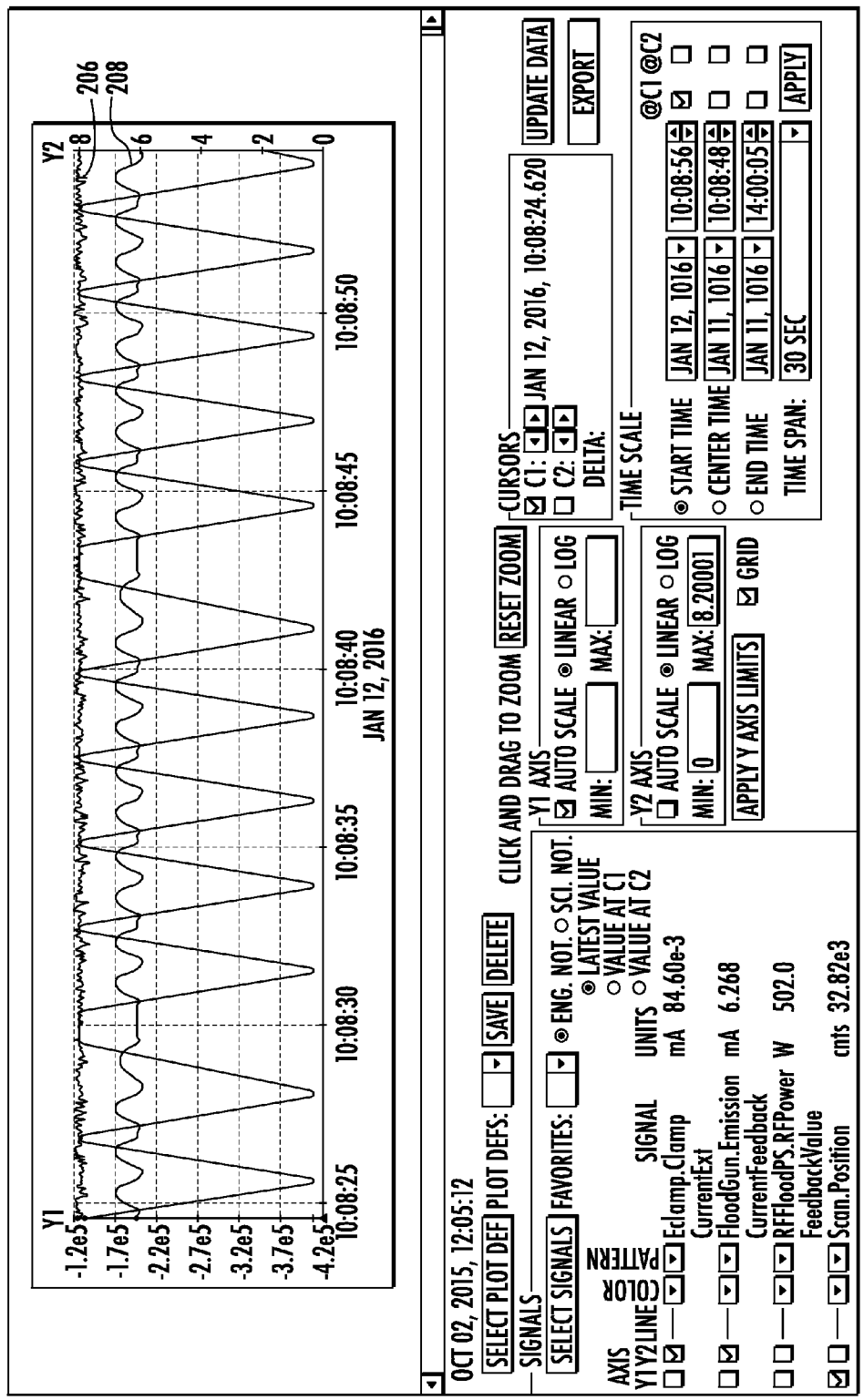

FIG. 2A and FIG. 2B present two different experimental results of current measurement during operation of a medium current ion implanter, where a toroidal plasma flood gun (TPFG) is operated in conjunction with a substrate clamp using a 3,000-4,000 Ω-cm HBR wafers. In operation use of a PFG mitigates an ion beam from depositing a charge on a substrate being implanted. This charge may damage devices by exceeding the breakdown field of gate oxides, and may even cause implant dosing issues by deflecting the ion beam itself. So the flux of electrons provided by the PFG may be adjusted to exceed the flux of positive ions in the beam, so the electrons are electrostatically attracted to the substrate and neutralize the charge deposited by the ion beam. The energy distribution of the electron flux may be controlled so negative charging at the substrate a PFG does not occur.

Turning now to FIG. 2A there is shown the results of electrostatic clamp current measurement, curve 202, and plasma flood gun current 204, shown as a function of time, when the power setting for the TPFG is 300 W. As evident from the curve 202, the amplitude of the clamp current has an average value of approximately 7 mA and fluctuates significantly, producing a variation in clamp current of approximately 1 mA. As shown, in FIG. 2B, when power setting for the TPFG is 500 W, the PFG current 208 is higher, while the clamp current variation, as shown by curve 206, decreases significantly, with fluctuation in clamp current on the order of 0.1 mA. The measured average clamp current also has a value of 8 mA as expected for operation under the given conditions. Notably, as indicated above, the average clamp current at 300 W is still sufficiently high so the 1 mA fluctuations do not induce a failure.

Figure 2C:
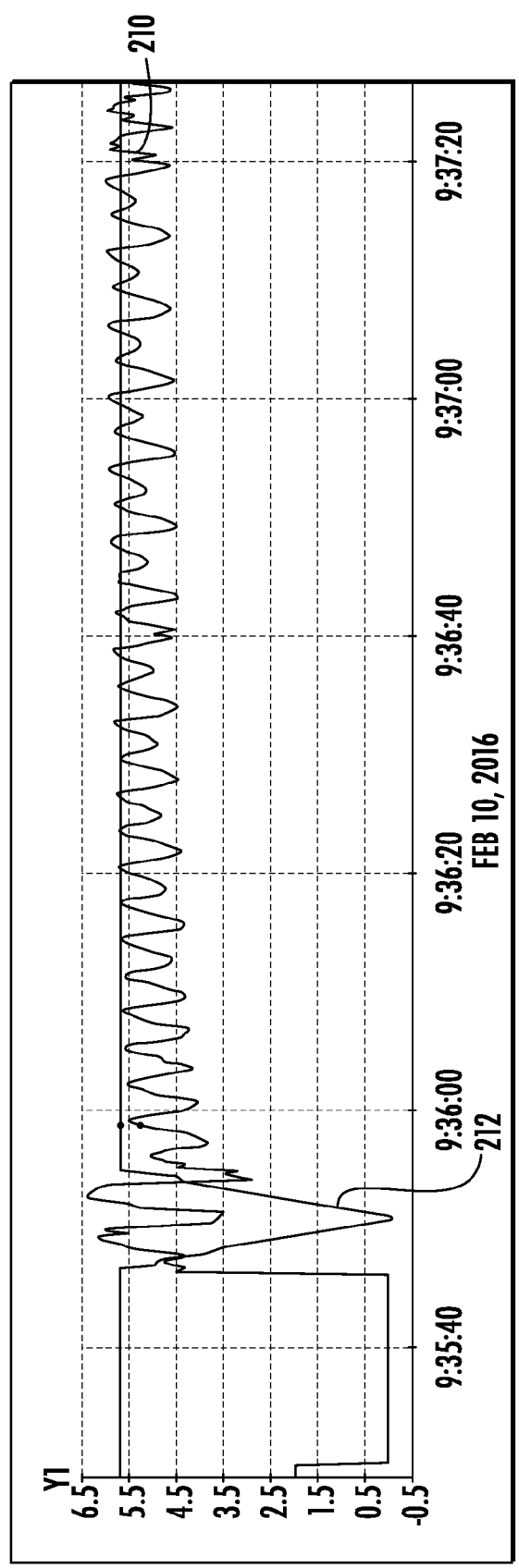
FIG. 2C provides experimental results during a failure due to clamp current variation.

FIG. 2C provides experimental results during a failure due to clamp current variation. The results are obtained using a filament PFG to expose a coated semiconductor substrate, where the bulk resistivity of the wafer was 17,000 Ω-cm. In this scenario, the clamp current waveform 210 shows a much lower average current of approximately 5 mA is observed, and an average variation in clamp current between minimum and maximum current is greater than 1 mA. In addition, a large variation in the amplitude, i.e., the difference between maximum current and minimum clamp current, is observed. This behavior results in a failure as exhibited by position curve 212, at approximately time 9:35:48 where especially large fluctuations in clamp current result in clamp current being below a 3.0 mA threshold value, causing an interruption in an implantation process.

Without limitation as to any particular theory, the results of FIG. 2A and FIG. 2B may be explained in the following manner. At sufficiently high power, electrons may be generated in the TPFG having a relatively higher energy compared with electrons generated at lower power, and may reach the HBR wafer. The electrons having a relatively higher energy may accordingly constitute a stabilizing concentration of electrons, leading to creation of addition charge carriers within the semiconductor material (silicon) constituting the HBR wafer, where the stabilizing concentration of electrons stabilizes and increase the wafer clamp current.

Figure 3:
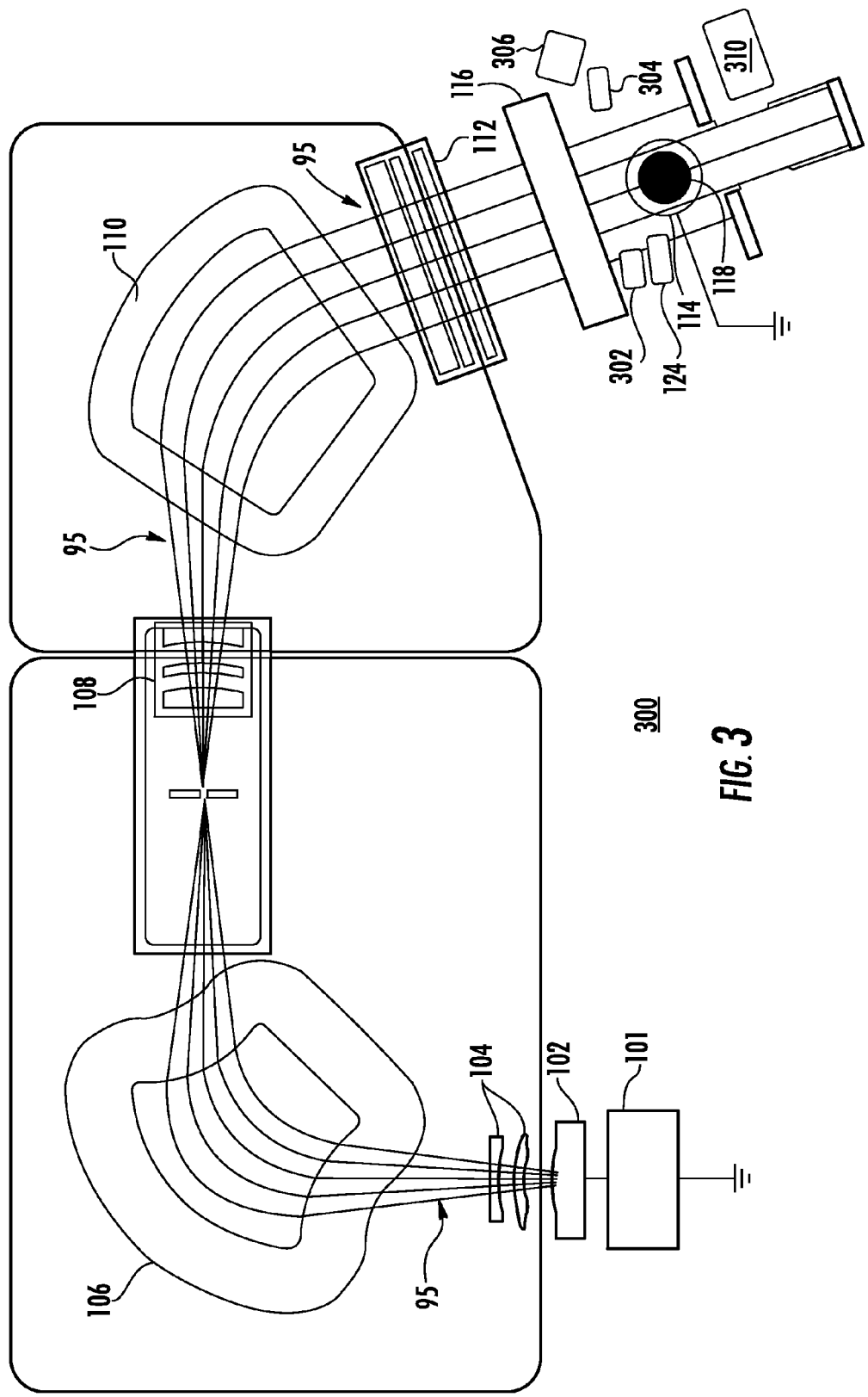
FIG. 3 presents another exemplary ion implanter according to further embodiments.

Another ion implanter, ion implanter 300, is generally shown in FIG. 3 and may include generally the same components as ion implanter 100. In addition, ion implanter 300 may include an illumination source 302 disposed near the substrate 118. In accordance with additional embodiments of the disclosure, the illumination source 302 may be operated to reduce clamp current variation at the platen 114. In various embodiments, the illumination source 302 may be an energetic source providing electromagnetic radiation of sufficient energy to generate additional charge carriers in a semiconductor substrate, such as represented by substrate 118.

In various embodiments, the illumination source 302 may be operated in conjunction with a PFG, including a TPFG to improve clamp current stability. In particular embodiments, the illumination source 302 may be a visible light source, an ultraviolet (UV) light source, an ion beam, or high energy radiation, and in particular may direct radiation to substrate 118 in the visible range, ultraviolet range, or higher energy range. According to additional embodiments, various illumination factors may be optimized in conjunction with clamping factors to improve stability of clamping current. These factors may include, but not limited to, frequency spectra, pulsation repetition, illumination intensity, incidence angle of illumination, type of illumination, clamping frequency, clamping voltage and charge rate (dV/dt).

In various embodiments, dynamic monitoring of the mentioned clamp current characteristics may be performed to improved stability of clamp current. In some embodiments the dynamic monitoring may be used in a feedback operation to adjust power of a TPFG or to adjust illumination parameters, or both, resulting in dynamic stabilization of clamp current. Referring again to FIG. 3, the ion implanter 300 may include a current monitor 124 coupled to the electrostatic clamp, shown as platen 114, to measure clamp current. The ion implanter 300 may also include a controller 306, where the controller 306 is coupled to the PFG 116, to the current monitor 124, and may also be coupled to the illumination source 302. In some embodiments the ion implanter 300 may include a $2^{nd}$ illumination source, shown as illumination source 304. The use of multiple illumination sources may be useful depending upon the configuration of a first illumination source and the bulk resistivity of a substrate being implanted. The controller 306 may be embodied in any combination of software and hardware. For example, the clamp current variation may be measured as a function of TPFG power of the PFG 116, so the power delivered to operate the TPFG can be adjusted by controller 306 according to the measured clamp current variation to generate a targeted level of stability in clamp current. For example, the TPFG power may be adjusted to achieve a fluctuation in clamp current of less than 0.5 mA. The embodiments are not limited in this context.

In particular, the clamp current waveform shape, i.e., area under the waveform, has been observed to change under the effect of illumination of a semiconductor wafer. The clamp current waveform signal may therefore be indicative of the changes in internal charge carriers in the HBR wafer. The apparatus and methods disclosed herein provide novel approaches to improving clamp current uniformity, since clamp current waveform shape may respond dynamically in-situ to changes during the implant process. In the present embodiments, by providing sources of energetic species of sufficient energy to a HBR wafer, the charge carriers within the HBR wafer may be dynamically adjusted to reduce clamp current fluctuations.

In some embodiments, clamp current waveform signals may be measured by microprocessor defined software or a data acquisition system. This measurement may entail connection to a power supply 310 of the electrostatic clamp being monitored. In some embodiments, software controlled by Varian Control System (VCS) may be used to detect changes in wafer clamp current using buffered memory data and VCS interrogating the buffered data at its slower sampling rate. Using an oscilloscope capturing waveforms from the clamp power supply, while possible, has the disadvantage of being labor intensive for capturing/analyzing data sets, is limited to "snapshots" in time, and does not provide continuous in-situ measurements.

In some embodiments, known numerical algorithms may be utilized for the capture and for the analysis of clamp current waveform signatures. In particular embodiments, software may in particular be incorporated into a platen power supply microprocessor designs. For example, a microprocessor may be programmed to perform the function of frequency analysis, such as fast Fourier transform (FFT) analysis of the clamp current waveform signals. In additional embodiments, instead of using a TPFG, a standard plasma flood gun (PFG) may be employed to improve clamp current stability. While conventional operation of a standard filament PFG at 2-4 Amps may not demonstrate appreciable improvement in clamp current stability, operating a PFG under conditions greater than 5 A produces greater electron energy and electron density. Accordingly, charge carriers may be induced in HBR wafers, such as at the wafer surface, to marginally improve clamp current stability.

FIG. 4 presents an exemplary process flow, shown as process flow 400, in accordance with additional embodiments of the disclosure. The process flow 400 may facilitate continuous implantation of HBR wafers without interruption due to electrostatic clamp current instability. In a first operation shown at block 402, implanting a high bulk resistance (HBR) wafer is performed, where the HBR wafer has a resistivity greater than 10-30 Ω-cm. At block 404 the operation of generating electrons in a plasma flood gun such as a toroidal plasma flood gun, may be performed, wherein the electrons impinge upon the HBR wafer during the implanting. At block 406, the operation of monitoring a clamp current at an electrostatic clamp holding the HBR wafer during the implanting may be performed. The monitoring of the clamp current may be performed intermittently or continuously. In some embodiments, the monitoring may be performed over a sufficient duration of time, such as several seconds up to many minutes, so as to determine a variation in clamp current, such as exhibited by a clamp current waveform where clamp current fluctuates over time. At block 408, the operation may be performed of adjusting power in the plasma flood gun according to the monitored clamp current, wherein a variation in clamp current is maintained below a target value.

FIG. 5 presents another exemplary process flow, shown as process flow 500, in accordance with further embodiments of the disclosure. At decision block 502, clamp current waveform information is received during an implantation process. At decision block 504 a determination is made as to whether clamp current variation exhibited by the clamp current waveform is below a target value. In one example, the target value may be 0.2 mA. The embodiments are not limited in this context. If so, the flow proceeds to block 506, where the implantation process continues with the present operating parameters. If not, the flow proceeds to block 508, where a control signal is sent to adjust power level of a plasma flood gun. The flow then returns to decision block 502.

Figure 6:
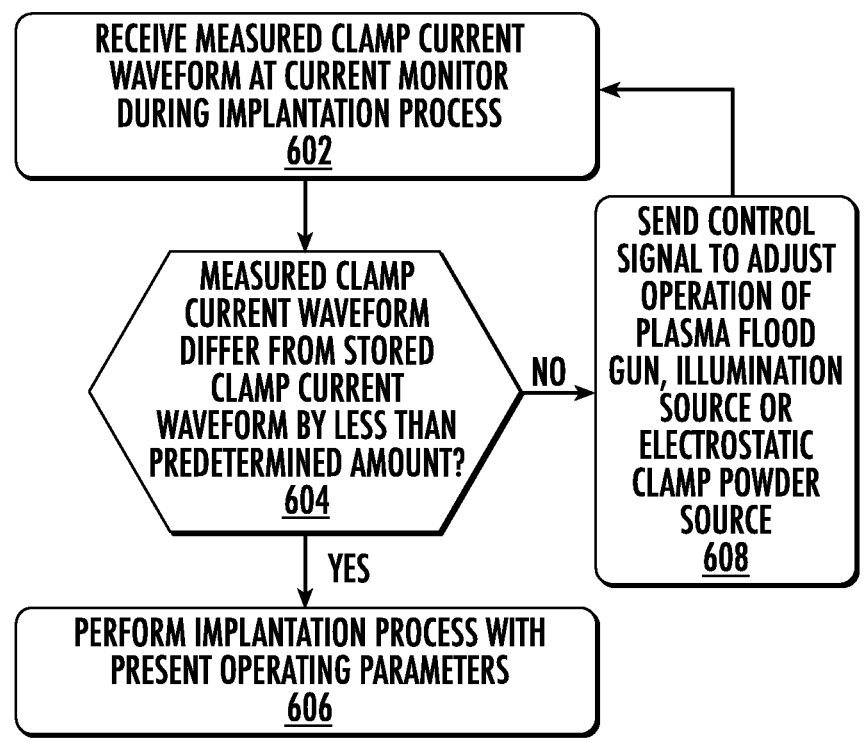
FIG. 6 presents a further process flow according to additional embodiments of the disclosure.

FIG. 6 presents another exemplary process flow, shown as process flow 600, in accordance with further embodiments of the disclosure. At decision block 602, a measured clamp current waveform is received at a current monitor during an implantation process. At decision block 604 a determination is made as to whether the measured clamp current waveform differs from a stored clamp current waveform by less than a predetermined amount. In one example, the predetermined amount may be 0.1 mA or may be 0.5 mA. In a particular variant, the predetermined amount may represent a difference in amplitude of the waveform, meaning a difference in the variation of clamp current between the measured clamp current waveform and the stored clamp current waveform. The embodiments are not limited in this context. If the difference is less than the predetermined amount, the flow proceeds to block 606, where the implantation process continues with the present operating parameters. If not, the flow proceeds to block 608, where a control signal is sent to adjust operation of a plasma flood gun, an illumination source or an electrostatic clamp power source, or any combination of the three. The flow then returns to decision block 602.

In some embodiments, clamp current waveform signals may be measured by microprocessor defined software or a data acquisition system. This measurement may entail connection to a power supply 310 of the electrostatic clamp being monitored.

Figure 7A:
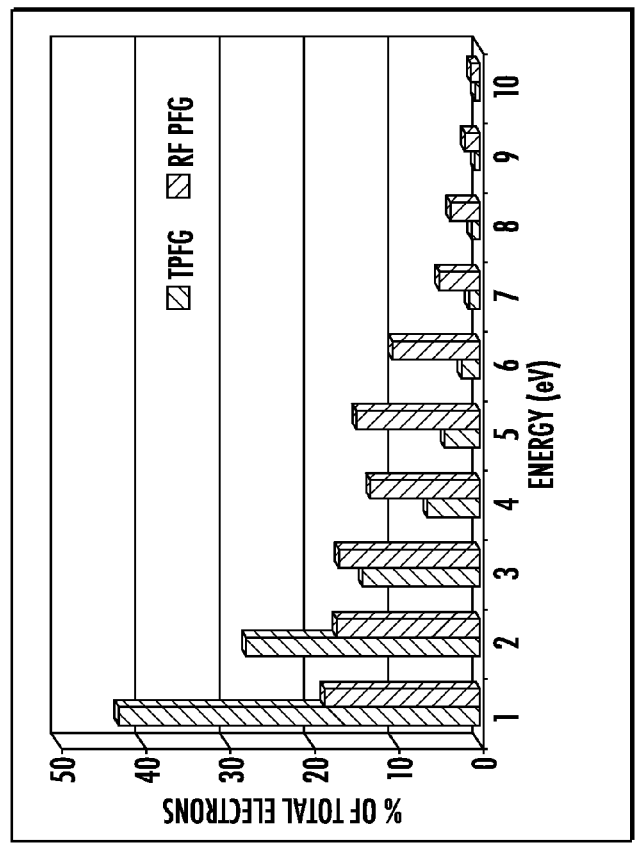
FIG. 7A and FIG. 7B provide electron energy distributions produced by exemplary plasma flood guns as measured using a retarding energy probe.
Figure 7B:
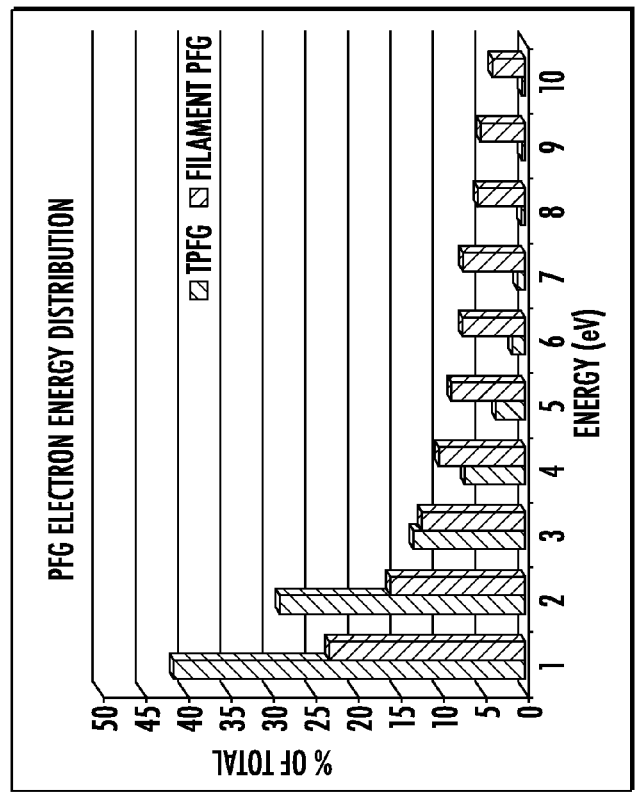

In summary, the present embodiments provide novel approaches to improving clamp current stability in clamps such as electrostatic clamps. The unexpected ability to stabilize clamp current using a TPFG has been demonstrated for the first time. Additional embodiments provide optimizing wafer illumination in conjunction with clamping, including using illumination in conjunction with exposure to electrons from a PFG, an in particular, a TPFG. In further embodiments, other plasma flood gun types may be employed to improve current stability in electrostatic clamps. FIG. 7A and FIG. 7B provide electron energy distributions produced by exemplary plasma flood guns as measured using a retarding energy probe 702 having a ground aperture plate 704 to measure electrons 706 emitted by a PFG, as shown in FIG. 7C. The apparatus of FIG. 7C provides a sufficiently accurate measurement of electron energy distribution for electrons emitted from a plasma flood gun. FIG. 7A compares the electron energy distribution from a TPFG to the electron energy distribution from a standard PFG, or filament PFG, while FIG. 7B compares the electron energy distribution from a TPFG to the electron energy distribution from a radio frequency (RF) PFG. In various embodiments an RF-PFG or a filament PFG may be operated at sufficient power to reduce clamp current, while operation of a TPFG may produce relatively superior results in comparison to a filament PFG or as explained below.

In a filament PFG the electron energy output, all other factors being fixed, is varied by changing the filament current, as measured in Amps (A), where conventional operation takes place at currents of 2-4 A, as noted. In some experiments, by raising the filament current to 7 Amps in a filament PFG a marginal improvement in ability to implant an HBR wafer without incurring an interruption in the implantation process has been observed. As shown in FIGS. 7A and 7B, the electron energy distribution is generally skewed toward the range of 1 eV and 2 eV for all 3 PFG designs. Notably, at 1 eV and 2 eV as revealed in both FIGS. 7A and 7B, the percentage of available electrons for the TPFG is significantly greater than in the filament PFG or the RF PFG. Without being bound by any particular theory, this greater percentage of available electrons at 1 eV and 2 eV provided by a TPFG operated according to the present embodiments may accordingly provide greater improvement in clamp current stability. Regardless of mechanism, when clamped HBR substrates are exposed to emission from a TPFG according to the present embodiments, the clamp current is greater and the clamp current variability between the maximum and minimum wafer clamp current is smaller. These improvements in turn maintain the clamp current above a minimum wafer clamp current threshold value defined, for example, by control software operating components of the ion implanter. The software may operate with a controller to sample the value of the clamp current periodically, and if sufficient samples at a given sampling rate fall below the threshold value, may send a signal to interrupt of the implant process. By maintaining the minimum value of clamp current more consistently above the threshold, generation of interrupts may be avoided or greatly lessened.

The present embodiments provide various advantages, given the variability in the HBR manufacturing process, differences between HBR suppliers and dynamic changes in the HBR wafer characteristics during implants. For example, various embodiments provide the ability to adjust parameters of an ion implanter in real time to avoid wafer handling problems. For example, in-situ monitoring of the wafer clamp current, analysis of the measured clamp current data and implementing dynamic control of a) TPFG power and/or b) illumination/operating conditions of lighting and electrostatic clamp power supply may be performed, in order to stabilize the HBR wafer clamp current. This real time monitoring and adjustment may provide the additional advantage of increasing substrate throughput by allowing continuous implantation of HBR wafers without interruption due to the ability to minimize clamp current variation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. An ion implanter, comprising:
an electrostatic clamp to hold a substrate;
a plasma flood gun generating a flux of electrons impinging upon the substrate; and
a controller coupled to the plasma flood gun and including a component generating a control signal responsive to a measurement signal, the control signal to adjust operation of the plasma flood gun to a target operating level,
wherein at the target operating level the flux of electrons comprises a stabilizing concentration of electrons, the stabilizing concentration reducing a clamp current variation in the electrostatic clamp to a target value, the target value being less than a second value of clamp current variation when the plasma flood gun is not operating.

2. The ion implanter of claim 1, wherein the plasma flood gun is a toroidal plasma flood gun.

3. The ion implanter of claim 1, wherein the target operating level of the plasma flood gun comprises a power of 200 W to 600 W.

4. The ion implanter of claim 1, further comprising at least one illumination source, the at least one illumination source directing visible range electromagnetic radiation to the substrate.

5. The ion implanter of claim 1, further comprising a current monitor to monitor the clamp current variation in the electrostatic clamp.

6. The ion implanter of claim 5, the controller comprising logic to adjust a power level of the plasma flood gun from a first power level to a second operating level, responsive to a measurement of the clamp current variation received from the current monitor.

7. The ion implanter of claim 1, wherein the target value is less than 1 mA and the second value is greater than 1 mA.

8. A method, comprising:
implanting a high bulk resistivity (HBR) wafer, the HBR wafer having a resistivity greater than 10 Ω-cm in an ion implanter;
monitoring a clamp current at an electrostatic clamp holding the HBR wafer; and
directing electrons from a plasma flood gun (PFG) to the HBR wafer during the implanting, wherein a variation in the clamp current is maintained below a target value.

9. The method of claim 8, wherein the electrons comprise an electron energy and electron density sufficient to generate charge carriers in the HBR wafer, the method further comprising implanting an additional HBR wafer,
wherein the implanting the HBR wafer and additional HBR wafer is performed without interruption.

10. The method of claim 8, wherein the PFG is a toroidal plasma flood gun.

11. The method of claim 8, wherein the directing the electrons comprises generating a power level of 200 W to 600 W in the PFG.

12. The method of claim 8, further comprising directing electromagnetic radiation from an energetic source to the HBR wafer during the implanting, responsive to a measured clamp current variation during the monitoring the clamp current.

13. The method of claim 12, wherein the energetic source comprises a visible light source, an ultraviolet (UV) light source, an ion beam, or high energy radiation, wherein the energetic source generates energetic species sufficient to generate charge carriers in the HBR wafer.

14. An apparatus, comprising:
an electrostatic clamp to hold a substrate;
a plasma flood gun generating a flux of electrons impinging upon the substrate;
a controller coupled to the plasma flood gun; and
at least one computer readable medium comprising instructions, where the instructions, when executed, cause the controller to:
receive a measurement signal; and
generate a control signal responsive to the measurement signal, the control signal to adjust operation of the plasma flood gun, wherein a variation in a clamp current is maintained below a target value.

15. The apparatus of claim 14, wherein the measurement signal comprises a measured clamp current variation.

16. The apparatus of claim 14, wherein the control signal generates a power level of 200 W to 600 W in the PFG.

17. The apparatus of claim 14, the at least one computer readable medium comprising instructions, where the instructions, when executed, cause the controller to:
generate a second control signal responsive to the measurement signal, the second control signal to direct electromagnetic radiation from an energetic source to the substrate, wherein the energetic source comprises a visible light source, an ultraviolet (UV) light source, an ion beam, or high energy radiation, wherein the energetic source generates energetic species sufficient to generate charge carriers in the substrate.

18. The apparatus of claim 14, wherein the measurement signal is a measured clamp current waveform, the at least one computer readable medium comprising instructions, where the instructions, when executed, cause the controller to:
  compare the measured clamp current waveform to a stored clamp current waveform; and
  generate the control signal when the measured clamp current waveform differs from the stored clamp current waveform by a predetermined amount.

19. The apparatus of claim 18, wherein the predetermined amount is 0.5 mA, and wherein the target value is 1 mA.

20. The apparatus of claim 18, the at least one computer readable medium comprising instructions, where the instructions, when executed, cause the controller to: perform fast Fourier transform (FFT) analysis of the measured clamp current waveform.

* * * * *